(12) United States Patent
Chong

(10) Patent No.: US 8,860,513 B1
(45) Date of Patent: Oct. 14, 2014

(54) INJECTION-LOCKED OSCILLATOR APPARATUS AND METHOD

(71) Applicant: FutureWei Technologies, Inc., Plano, TX (US)

(72) Inventor: Euhan Chong, Ottawa (CA)

(73) Assignee: Futurewei Technologies, Inc., Plano, TX (US)

(*) Notice: Subject to any disclaimer, the term of this patent is extended or adjusted under 35 U.S.C. 154(b) by 20 days.

(21) Appl. No.: 13/901,815

(22) Filed: May 24, 2013

(51) Int. Cl.
*H03L 7/24* (2006.01)
*H03K 3/03* (2006.01)
*H03L 7/099* (2006.01)

(52) U.S. Cl.
CPC .................................. *H03L 7/0995* (2013.01)
USPC ........................... 331/57; 331/55; 331/172

(58) Field of Classification Search
CPC ....... H03K 3/0315; H03K 3/0322; H03L 7/24
USPC ................... 331/57, 46, 55, 50, 172
See application file for complete search history.

(56) References Cited

U.S. PATENT DOCUMENTS

| | | | |
|---|---|---|---|
| 6,188,291 B1 * | 2/2001 | Gopinathan et al. ............. 331/45 |
| 7,414,489 B2 * | 8/2008 | Dally et al. ................... 331/172 |
| 2014/0043105 A1 * | 2/2014 | Zerbe et al. .................... 331/50 |
| 2014/0049328 A1 * | 2/2014 | Smith et al. .................... 331/57 |

OTHER PUBLICATIONS

O'Mahony, F., et al., "A Programmable Phase Rotator based on Time-Modulated Injection-Locking," Department of Electrical and Computer Engineering, Symposium on VLSI Circuits/Technical Digest of Technical Papers, 2010, pp. 45-46.

* cited by examiner

*Primary Examiner* — Ryan Johnson
(74) *Attorney, Agent, or Firm* — Slater & Matsil, L.L.P.

(57) ABSTRACT

An apparatus comprises a ring oscillator comprising a plurality of delay cells connected in cascade, a main injection apparatus comprising a plurality of main buffers, wherein the main buffers receive a reference clock from their inputs and the outputs of the main buffers are coupled to respective inputs of the delay cells and a replica injection apparatus comprising a plurality of replica buffers, wherein the replica buffers receive the reference clock from their inputs and the replica buffers are configured such that the replica buffers are tri-stated and each output is connected to ground when the ring oscillator operates in an injection-locked mode and each output is connected to ground through a capacitor when the ring oscillator operates in a calibration mode.

20 Claims, 5 Drawing Sheets

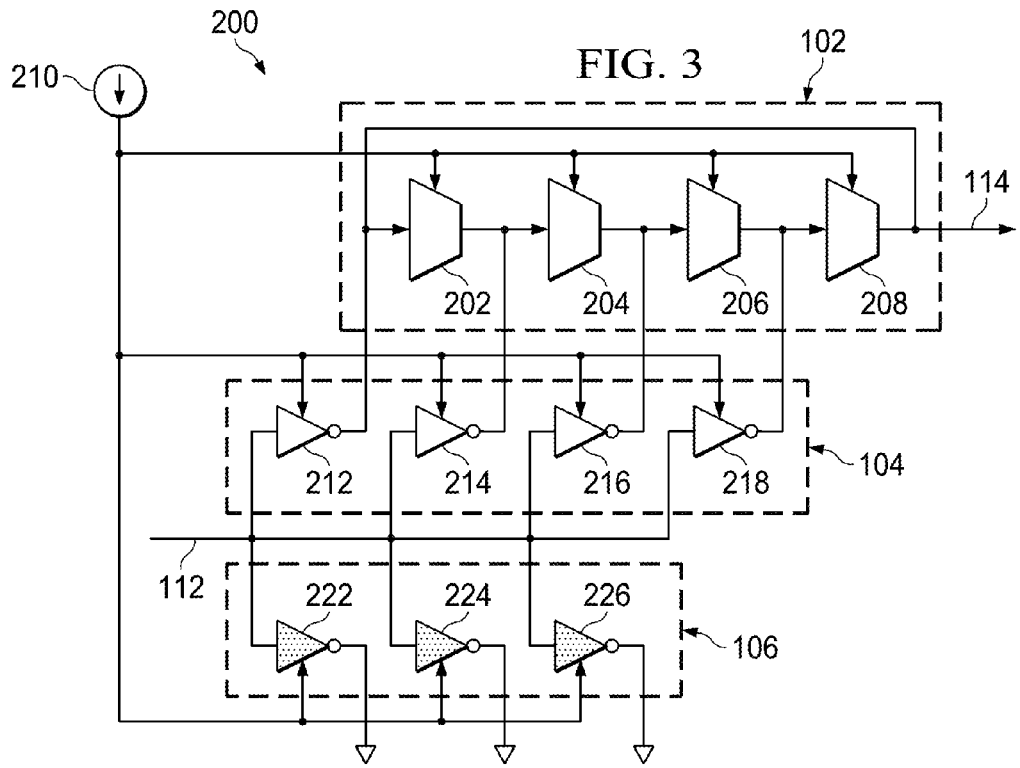
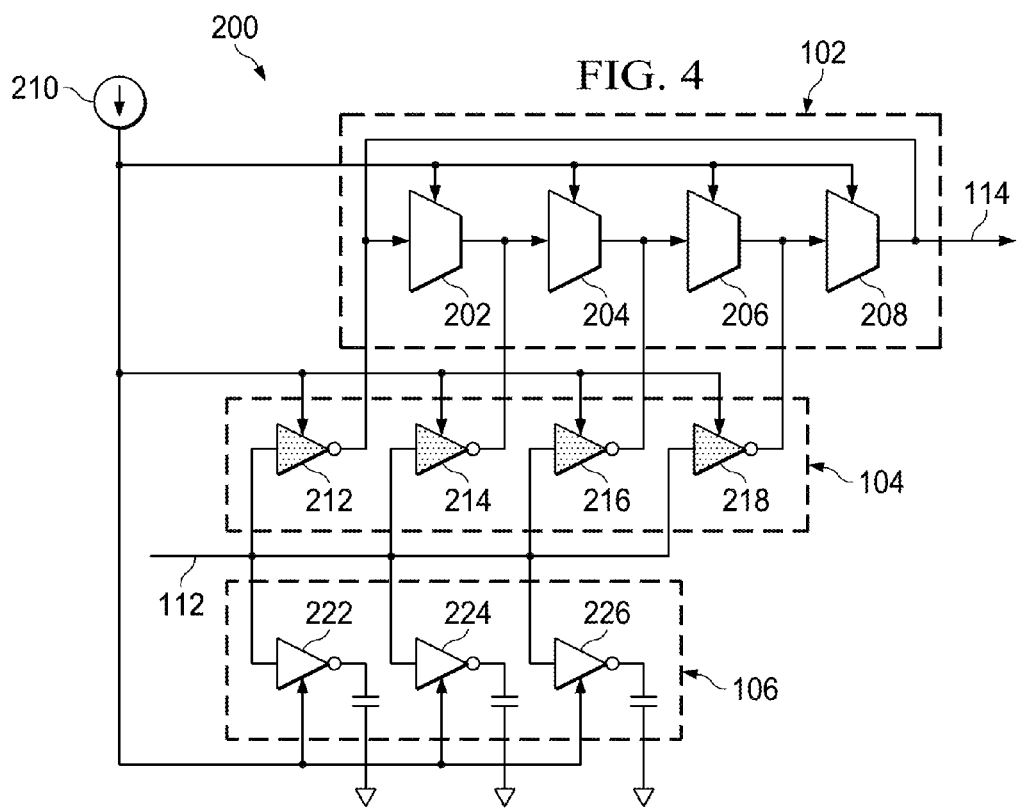

700

| CALIBRATION LOOK UP TABLE | | |
|---|---|---|
| ILO COARSE CODE | INJECTION SETTING | |
| coarse_tune <3:0> | A <2:0> | B <2:0> |
| 15 | 6 | 3 |
| 14 | 6 | 3 |
| 13 | 6 | 3 |
| 12 | 6 | 3 |
| 11 | 6 | 3 |
| 10 | 6 | 2 |
| 9 | 6 | 2 |
| 8 | 6 | 2 |
| 7 | 6 | 2 |
| 6 | 5 | 2 |
| 5 | 4 | 2 |
| 4 | 3 | 2 |
| 3 | 3 | 0 |
| 2 | 2 | 0 |
| 1 | 1 | 0 |
| 0 | 0 | 0 |

INJECTION-LOCKED OSCILLATOR APPARATUS AND METHOD

TECHNICAL FIELD

The present invention relates to an injection-locked oscillator apparatus, and more particularly, to a method to calibrate the injection-locked oscillator apparatus.

BACKGROUND

Wireless communication systems are widely used to provide voice and data services for multiple users using a variety of access terminals such as cellular telephones, laptop computers and various multimedia devices. Such communications systems can encompass local area networks, such as IEEE 801.11 networks, cellular telephone and/or mobile broadband networks. The communication system can use one or more multiple access techniques, such as Frequency Division Multiple Access (FDMA), Time Division Multiple Access (TDMA), Code Division Multiple Access (CDMA), Orthogonal Frequency Division Multiple Access (OFDMA), Single Carrier Frequency Division Multiple Access (SC-FDMA) and others. Mobile broadband networks can conform to a number of standards such as the main $2^{nd}$-Generation (2G) technology Global System for Mobile Communications (GSM), the main $3^{rd}$-Generation (3G) technology Universal Mobile Telecommunications System (UMTS) and the main $4^{th}$-Generation (4G) technology Long Term Evolution (LTE).

A wireless network may include a wireless device and a plurality of base stations. The wireless device may be a notebook computer, a mobile phone or a Personal Digital Assistant (PDA), a media player, a gaming device or the like. The base stations communicate with the wireless device over a plurality of wireless channels coupled between the wireless device and the base stations (e.g., a downlink channel from a base station to a wireless device). The wireless device may send back information, including channel information, to the base stations over a plurality of feedback channels (e.g., an uplink channel from the wireless device to the base station).

The wireless device may include a transceiver coupled between an antenna and a baseband processor. The transceiver may comprise a first mixer coupled to a local oscillator. The local oscillator generates a signal at an intermediate frequency suitable for the baseband processor. After being processed by the first mixer, an in-phase (I) signal having the intermediate frequency is generated and sent to the baseband processor.

The transceiver further comprises a second mixer coupled to the local oscillator through a phase shifter. The phase shifter adds a 90 degree phase shift to the signal generated by the local oscillator. The second mixer generates a quadrature (Q) signal for digital signal processing in the baseband processor.

The local oscillator may be implemented as an injection-locked oscillator. Such an injection-locked oscillator may provide a wide locking range as well as low power consumption. In addition, the injection-locked oscillator may be employed to generate a multiple-phase clock. The multi-phase clock may be used to sample and track a variety of received data signals in the wireless device.

SUMMARY OF THE INVENTION

These and other problems are generally solved or circumvented, and technical advantages are generally achieved, by preferred embodiments of the present invention which provide a system, apparatus and method for calibrating an injection-locked oscillator.

In accordance with an embodiment, an apparatus comprises a ring oscillator comprising a plurality of delay cells connected in cascade, a main injection apparatus comprising a plurality of main buffers, wherein the main buffers receive a reference clock from their inputs and outputs of the main buffers are coupled to respective inputs of the delay cells and a replica injection apparatus comprising a plurality of replica buffers, wherein the replica buffers receive the reference clock from their inputs and the replica buffers are configured such that the replica buffers are tri-stated and each output is connected to ground when the ring oscillator operates in an injection-locked mode and each output is connected to ground through a capacitor when the ring oscillator operates in a calibration mode.

In accordance with another embodiment, a system comprises a calibration apparatus comprising an amplitude comparator, a frequency detector and a calibration state machine, wherein the calibration apparatus generates a fine-tuning code and a coarse-tuning code, an adjustable current source coupled to the calibration apparatus and an injection-locked oscillator comprising a ring oscillator comprising a plurality of delay cells connected in cascade, wherein an output of the ring oscillator is connected to the calibration apparatus, a main injection apparatus comprising a plurality of main buffers, wherein the main buffers receive a reference clock from their inputs and the outputs of the main buffers are coupled to respective inputs of the delay cells and a replica injection apparatus comprising a plurality of replica buffers, wherein bias currents of the delay cells, the main buffers and the replica buffers are provided by the adjustable current source.

In accordance with yet another embodiment, a method comprises, during an injection-locked mode, coupling outputs of a plurality of replica buffers of a replica injection apparatus to ground, disabling the replica buffers and injecting a reference clock into a ring oscillator having a plurality of delay cells through a plurality of main buffers of a main injection apparatus, wherein the main buffers receive the reference clock from their inputs and the outputs of the main buffers are coupled to respective inputs of the delay cells.

The method further comprises, during a calibration mode, coupling each output of the plurality of replica buffers of the replica injection apparatus to ground through a capacitor and disabling the main buffers of the main injection apparatus and during the calibration mode, comparing an output signal of the ring oscillator with the reference clock and generating a fine-tuning calibration code and a coarse-tuning calibration code.

An advantage of a preferred embodiment of the present invention is eliminating or reducing the mismatch between the frequency of an output signal of an injection-locked oscillator and the frequency of the input signal of the injection-locked oscillator. As a result, the method may improve a variety of performance characteristics such as phase mismatch, frequency error, tracking bandwidth, wide locking range, reduced jitter, low power consumption and/or the like.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates a schematic diagram of the injection-locked oscillator operating in an injection-locked mode in accordance with various embodiments of the present disclosure;

FIG. 4 illustrates a schematic diagram of the injection-locked oscillator operating in a calibration mode in accordance with various embodiments of the present disclosure;

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely calibrating an injection-locked oscillator using a digital calibration algorithm. The invention may also be applied, however, to calibrating a variety of oscillators. Hereinafter, various embodiments will be explained in detail with reference to the accompanying drawings.

Figure 1:
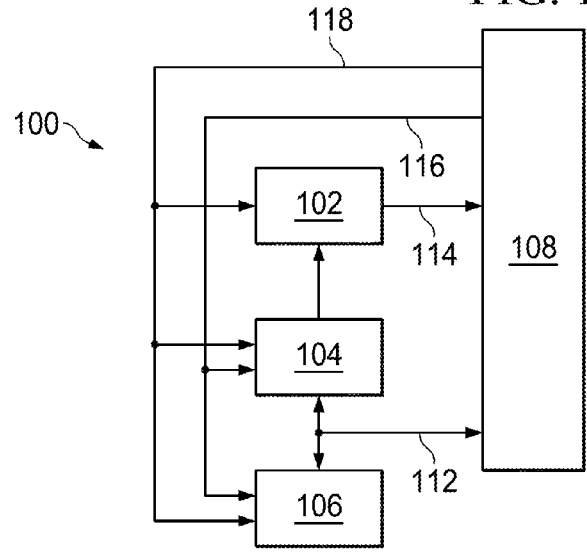
FIG. 1 illustrates a block diagram of an injection-locked oscillator in accordance with various embodiments of the present disclosure.

FIG. 1 illustrates a block diagram of an injection-locked oscillator in accordance with various embodiments of the present disclosure. The injection-locked oscillator 100 includes a ring oscillator 102, a main injection apparatus 104, a replica injection apparatus 106 and a calibration apparatus 108. As shown in FIG. 1, a reference clock 112 may be fed into the main injection apparatus 104, the replica injection apparatus 106 as well as the calibration apparatus 108.

The main injection apparatus 104 is coupled to the ring oscillator 102. In particular, the reference clock 112 may be injected into the ring oscillator 102 at multiple injection points through the main injection apparatus 104. In other words, the main injection apparatus 104 may function as a buffer coupled between the reference clock 112 and the ring oscillator 102. The detailed schematic of the main injection apparatus 104 will be described below with respect to FIG. 2.

The ring oscillator 102 receives injected signals from the main injection apparatus 104. Meanwhile, the ring oscillator 102 generates a clock 114. The clock 114 may function as a clock signal for a clock/data recovery circuit (CDR) to sample and track a variety of received data signals (not shown).

In some embodiments, the frequency and/or the center frequency of the clock 114 may match the frequency of the injected signal from the main injection apparatus 104. A mismatch between the frequency of the clock 114 and the injected signal such as the reference clock 112 may cause degraded performance characteristics such as phase mismatch, reduced tracking bandwidth, reduced locking range, increased jitter, any combinations thereof and/or the like.

The calibration apparatus 108 receives the reference clock 112 and the clock 114. Based upon a calibration algorithm, which will be discussed in detail below with respect to FIGS. 5-8, the calibration apparatus 108 generates a first calibration signal 116 and a second calibration signal 118. As shown in FIG. 1, the first calibration signal 116 is fed into the main injection apparatus 104 as well as the replica injection apparatus 106. The second calibration signal 118 is fed into the ring oscillator 102, the main injection apparatus 104 and the replica injection apparatus 106.

In some embodiments, the first calibration signal 116 is employed to coarsely tune some tunable parameters such as the gains of the buffers (not shown but illustrated in FIG. 2) of the main injection apparatus 104 as well as the replica injection apparatus 106. Throughout the description, the first calibration signal 116 is alternatively referred to as a coarse-tuning code 116.

The second calibration signal 118 is employed to fine-tune some tunable parameters such as the bias currents of the buffers and delay cells (not shown but illustrated in FIG. 2) of the ring oscillator 102. Throughout the description, the second calibration signal 118 is alternatively referred to as a fine-tuning code 118.

In sum, by employing the coarse-tuning code 116 and the fine-tuning code 118, the output signal of the ring oscillator 102 may closely match the injected signal of the ring oscillator 102. Furthermore, different operation conditions such as a different environmental temperature or a different operating voltage may not cause an offset or error of the frequency of the output signal because the calibration apparatus 108 helps to correct the offset/error through the coarse-tuning code 116, the fine-tuning code 118 and any combinations thereof.

Figure 2:
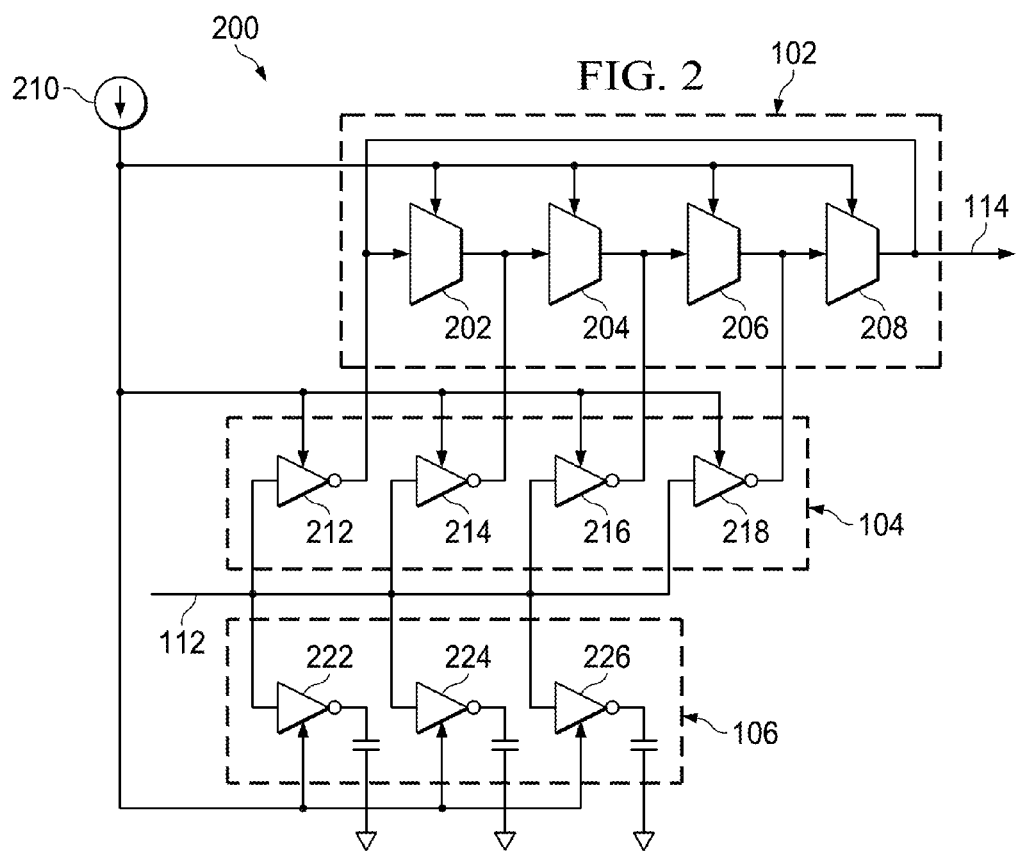
FIG. 2 illustrates a schematic diagram of the injection-locked oscillator shown in FIG. 1 in accordance with various embodiments of the present disclosure.

FIG. 2 illustrates a schematic diagram of the injection-locked oscillator shown in FIG. 1 in accordance with various embodiments of the present disclosure. The injection-locked oscillator 200 may comprise a ring oscillator 102, a main injection apparatus 104 and a replica injection apparatus 106. In some embodiments, the ring oscillator 102 may comprise four delay cells 202, 204, 206 and 208, which are connected in cascade as shown in FIG. 2. An injected signal is fed into the input of each delay cell (e.g., delay cell 202). The output of the delay cell 208 is the clock 114. In addition, the output of the delay cell 208 is fed into the input of the delay cell 202 to form the ring oscillator 102. The operation principle of a ring oscillator is well known in the art, and hence is not discussed in further detail to avoid repetition.

It should be noted that the schematic diagram of the ring oscillator is merely an example, which should not unduly limit the scope of the claims. One of ordinary skill in the art would recognize many variations, alternatives, and modifications. For example, the ring oscillator may have different configurations such as including differing numbers of delay elements (e.g., six delay cells connected in cascade).

The main injection apparatus 104 may comprise four injectors. In some embodiments, the injectors may be implemented as buffers. Throughout the description, the injectors are alternatively referred to as buffers. As shown in FIG. 2, the main injection apparatus 104 may comprise four buffers, namely a first buffer 212, a second buffer 214, a third buffer 216 and a fourth buffer 218.

In some embodiments, each buffer may be implemented as an inverter, a plurality of inverters connected in parallel and the like. The reference clock 112 is fed into each buffer and injected into the respective inputs of the delay cells.

One of desirable features of the injection-locked oscillator 200 is that the center frequency of the clock 114 is approximately equal to the frequency of the reference clock 112. On the other hand, another desirable feature of the injection-locked oscillator 200 is a wide locking range. Such a wide locking range may be achieved by using a plurality of strong injection signals (a.k.a. strong injection strength). However, the strong injection signals may cause a mismatch between the clock 114 and the reference clock 112. A calibration process based upon a digital calibration algorithm is employed to minimize the mismatch between the clock 114 and the reference clock 112. The calibration process will be described below with respect to FIGS. 4-8

It should be noted that the buffers and delay cells describe above are tunable elements. For example, each buffer may be of an adjustable gain. In addition, the bias current of each buffer is adjustable too. By adjusting the bias currents of the buffers as well as the delay cells, the frequency of the clock 114 may be fine-tuned accordingly. On the other hand, the amplitude of the clock 114 may not match the reference clock 112. By adjusting the gains of the buffers, the amplitude of the clock 114 may be coarsely tuned as a result. The detailed operation of the fine-tuning and coarse-tuning processes will be described below with respect to FIGS. 6-8.

The replica injection apparatus 106 may comprise three buffers 222, 224 and 226. Each buffer may be of the same structure and characteristics as their respective buffers in the main injection apparatus 104. FIG. 2 shows each buffer such as buffer 222 has an output coupled to ground through a capacitor. This connection is merely example. One of ordinary skill in the art would recognize many variations, alternatives, and modifications. For example, the output of the buffer 222 may be coupled to ground directly depending on different operating modes. The detailed operation principle of the replica injection apparatus 106 will be described below with respect to FIGS. 3-4.

FIG. 2 further illustrates an adjustable current source 210. The adjustable current source 210 is employed to provide bias currents for the buffers (e.g., buffer 212 and buffer 222) as well as the delay cells (e.g., delay cell 202). In response to a fine-tuning code generated by the calibration apparatus 108 (not shown but illustrated in FIG. 1), the bias currents may vary accordingly. As a result, there may be a fine adjustment of the frequency of the clock 114 at the output of the ring oscillator 102.

FIG. 3 illustrates a schematic diagram of the injection-locked oscillator operating in an injection-locked mode in accordance with various embodiments of the present disclosure. During the injection-locked mode, the buffers of the replica injection apparatus 106 are tri-stated. In addition, the outputs of the buffers are coupled to ground as shown in FIG. 3. Such a configuration of the replica injection apparatus 106 helps to reduce noise interference through the replica injection apparatus 106.

FIG. 3 further illustrates the buffers of the main injection apparatus 104 are turned on. In addition, each buffer of the main injection apparatus 104 may be of a different gain so that the injection-locked oscillator 200 may maintain a wide locking range. Furthermore, the main buffers having different gains may help to minimize the frequency error of the injection-locked oscillator 200. An illustrative embodiment of buffers with different gains will be described below with respect to FIG. 8.

FIG. 4 illustrates a schematic diagram of the injection-locked oscillator operating in a calibration mode in accordance with various embodiments of the present disclosure. During the calibration mode, the buffers of the main injection apparatus 104 are turned off. As a result, the outputs of the buffers are tri-stated. In other words, the ring oscillator 102 operates in a free-running mode.

FIG. 4 further illustrates the buffers of the replica injection apparatus 106 are turned on. In addition, the outputs of the replica buffers (e.g., buffer 222) are coupled to ground through a capacitor as shown in FIG. 4. Such a capacitor may function as a loading capacitor. The loading capacitor may be implemented as a metal oxide semiconductor (MOS) capacitor. The loading capacitor is used to match the loading at the output of the buffer (e.g., buffer 212) of the main injection apparatus 104.

In some embodiments, the replica buffers may be tuned in the same way as the main buffers when the injection-locked oscillator 200 operates in a calibration mode. During the tuning process, the capacitive loading of the free-running ring oscillator matches the capacitive loading of the ring oscillator in the injection-locked mode. As such, the replica buffers are capable of calibrating the ring oscillator 102 so as to compensate the frequency error caused by the main buffers. The detailed calibration process will be illustrated below with respect to FIGS. 5-8.

Figure 5:
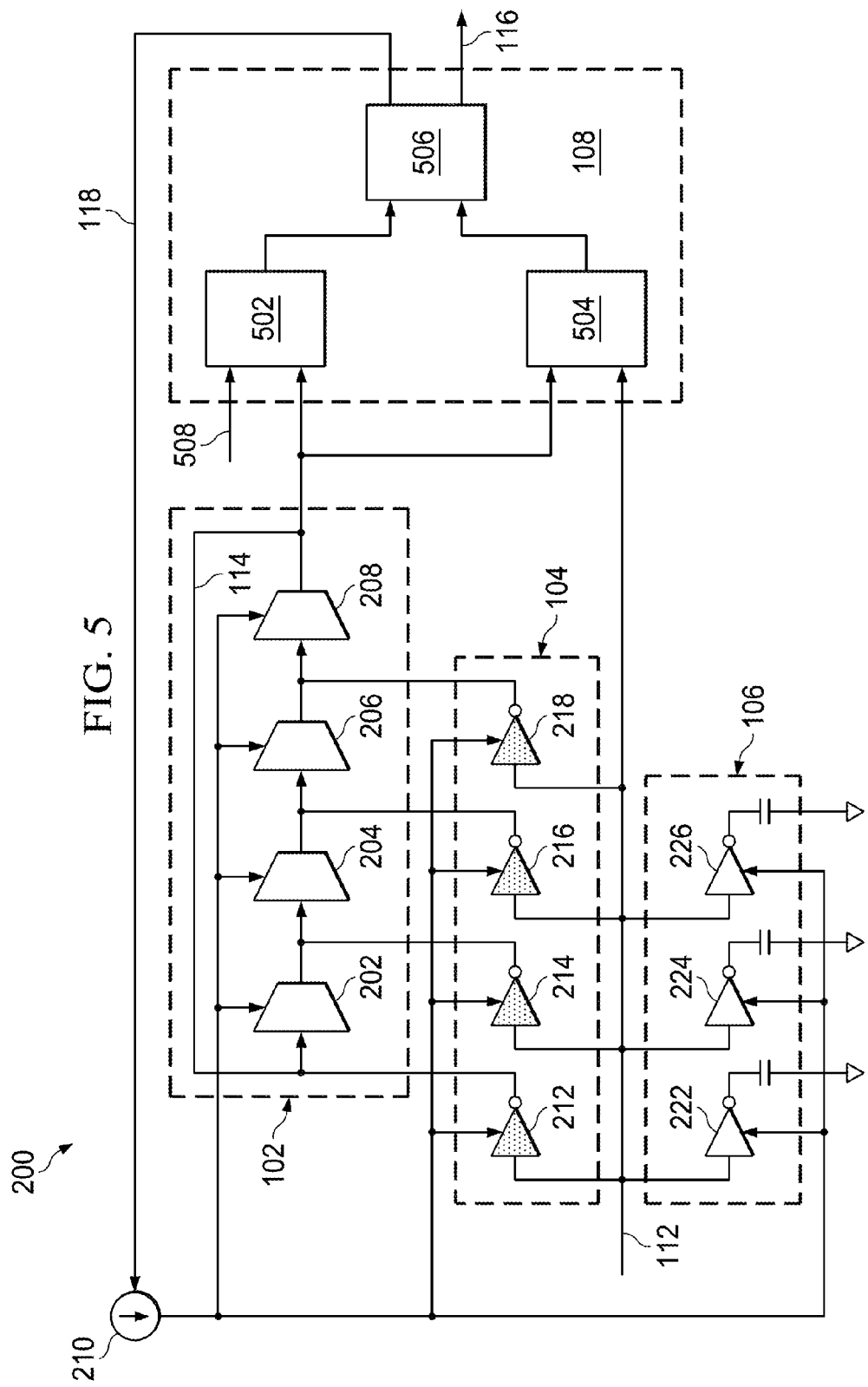
FIG. 5 illustrates a block diagram of the calibration apparatus in accordance with various embodiments of the present disclosure.

FIG. 5 illustrates a block diagram of the calibration apparatus in accordance with various embodiments of the present disclosure. As shown in FIG. 5, the buffers of the main injection apparatus 104 drawn in grey indicate that the buffers are tri-stated. In other words, the injection-locked oscillator operates in a calibration mode.

The calibration apparatus 108 includes three function units, namely an amplitude comparator 502, a frequency detector 504 and a calibration state machine 506. It should be noted that the block diagram shown in FIG. 5 is merely an example. A person skilled in the art will recognize that, depending on different applications and design needs, the calibration apparatus 108 may comprise other function units. For example, the calibration apparatus 108 may comprise a frequency divider (not shown) to process and distribute the detected signal.

The calibration apparatus 108 receives signals from the ring oscillator 102. In particular, the clock 114 is fed into the amplitude comparator 502 as well as the frequency detector 504. In some embodiments, the frequency of the clock 114 is calibrated first. More particularly, the frequency of the clock 114 is detected by the frequency detector 504, and further compared with the reference clock 112. The comparison result is fed into the calibration state machine 506, wherein a calibration algorithm is executed to generate a fine-tuning code 118. As shown in FIG. 5, the fine-tuning code 118 is used to adjust the amplitude of the adjustable current source 210. As a result, the bias currents of the main buffers, the replica buffers and delay cells may vary in response to the change of the amplitude of the adjustable current source 210. The change of the bias currents helps to fine-tune the frequency of the clock 114 so as to make the frequency of the clock 114 in a range to which the injection-locked oscillator 200 is specified.

Once the frequency of the clock 114 is fine-tuned, the calibration apparatus 108 starts to calibrate the amplitude of the clock 114. The amplitude comparator 502 receives a predetermined reference signal 508. In some embodiments, the predetermined reference signal 508 is equal to the amplitude of the reference clock 112. The amplitude comparator 502 also detects the amplitude of the clock 114. The comparison result between the amplitude of the clock 114 and the reference signal 508 is sent to the calibration state machine 506.

An amplitude calibration algorithm is executed to generate a coarse-tuning code. Such a coarse-tuning code is used to adjust the gains of the buffers of the main injection apparatus 104. The calibration apparatus 108 repeats the amplitude calibration process described above until the amplitude of the clock 114 is greater than or equal to the predetermined reference signal 508.

The coarse-tuning code 116 is used to adjust the gains of the buffers in the main injection apparatus. The buffers in the replica injection apparatus match their respective buffers in the main injection apparatus. As a result, the gains of the buffers in the replica injection apparatus may change in response to the change of the gains of the buffers in the main injection apparatus. One illustrative embodiment of the coarse-tuning code 116 will be illustrated below with respect to FIG. 7.

Figures 6, 7:
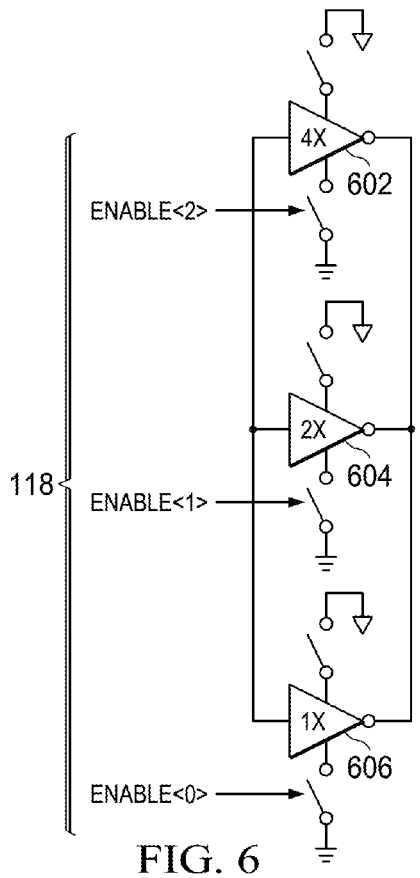
FIG. 6 illustrates a schematic diagram of a tunable buffer in accordance with various embodiments of the present disclosure.
FIG. 7 illustrates an illustrative embodiment of a calibration look up table in accordance with various embodiments of the present disclosure.

FIG. 6 illustrates a schematic diagram of a tunable buffer in accordance with various embodiments of the present disclosure. Each buffer shown in FIG. 6 may comprise a plurality of buffers connected in parallel. FIG. 6 illustrates a buffer comprising three digitally controlled buffers, namely a first digitally controlled buffer 602, a second digitally controlled buffer 604 and a third digitally controlled buffer 606. The digitally controlled buffers 602, 604 and 606 may form a binary weighted circuit. As shown in FIG. 6, the gains of buffers 602, 604 and 606 are in the ratio 4:2:1.

The on/off of each digitally controlled buffer is determined by an enable signal. In particular, when the enable signal is set to 1, the digitally controlled buffer is enabled. On the other hand, when the enable signal is set to 0, the digitally controlled buffer is disabled. In some embodiments, the enable signal may comprise three digits. Each digit corresponds to an enable signal. An illustrative embodiment of the enable signal will be described below with respect to FIG. 7.

FIG. 7 illustrates an illustrative embodiment of a calibration loop up table in accordance with various embodiments of the present disclosure. The coarse-tuning code 118 may be set based upon a calibration lookup table 700 as shown in FIG. 7. The coarse-tuning code 118 may comprise four digits. Each buffer may have three control bits to adjust the gains (e.g., gain A or gain B shown in the lookup table). The detailed description of gain A and gain B will be described below with respect to FIG. 8.

Figure 8:
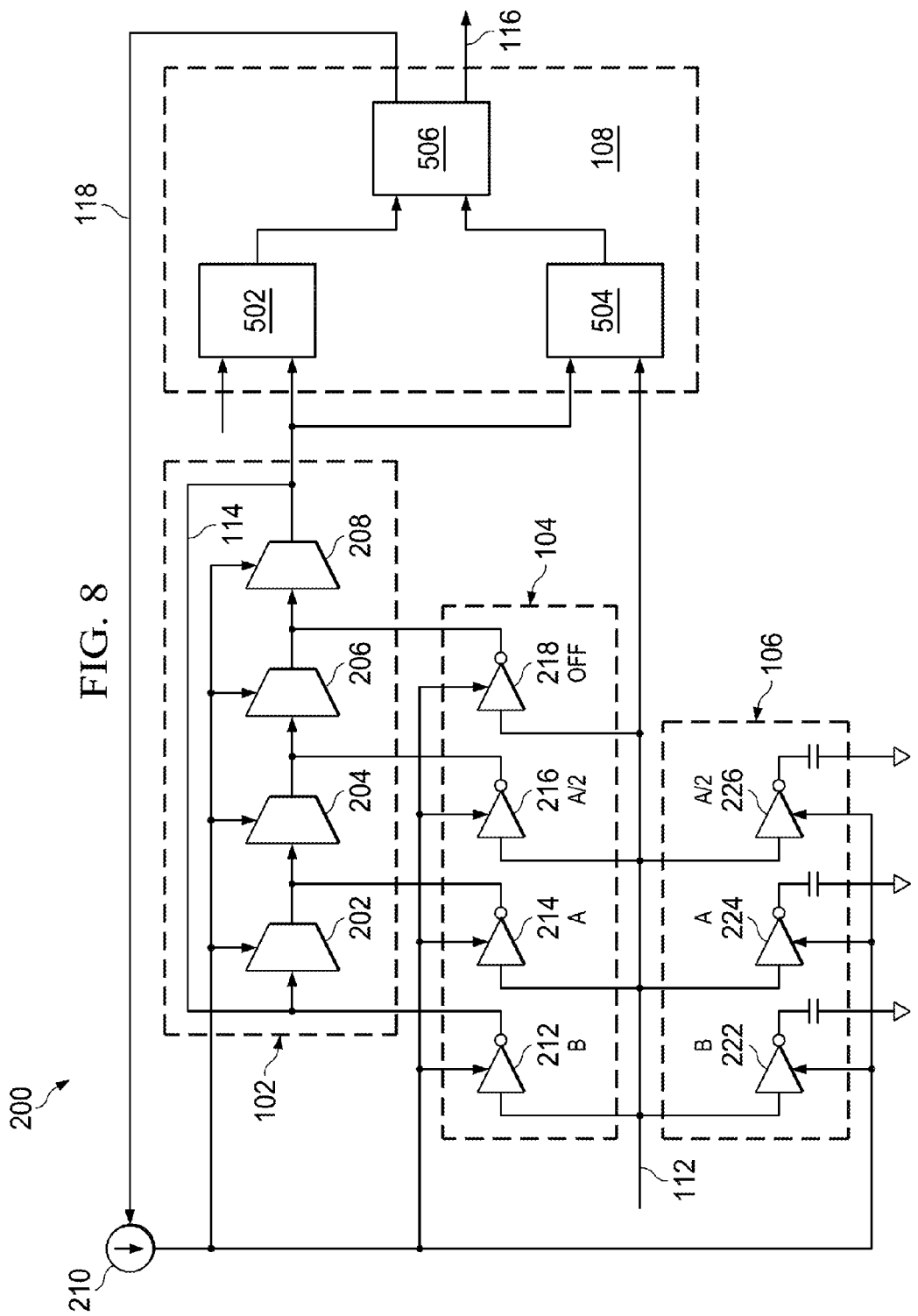
FIG. 8 illustrates a schematic diagram of the injection-locked oscillator after a calibration process is applied to the gains of the main buffers and replica buffers in accordance with various embodiments of the present disclosure.

FIG. 8 illustrates a schematic diagram of the injection-locked oscillator after a calibration process is applied to the gains of the main buffers and replica buffers in accordance with various embodiments of the present disclosure. As shown in FIG. 8, the first buffer 212 is of a gain B. The second buffer 214 is of a gain A. The gain A and gain B can be adjusted to increase the injection-locked range of the injection-locked oscillator 200. The third buffer 216 may be of a gain of A/2.

It should be noted that the gain of A/2 helps to reduce phase mismatch and frequency error. In an injection-locked oscillator, it is difficult to achieve a wide locking range through strong injection without suffering phase mismatch and frequency error. One advantageous feature of having a reduced gain buffer such as the third buffer 216 is that the injection-locked oscillator 200 not only achieves a wide frequency locking range, but also eliminates or minimizes the mismatch between the frequency of the reference clock 112 and the frequency of the clock 114.

FIG. 8 further illustrates the fourth buffer 218 is turned off. The fourth buffer 218 is employed to match the capacitive loading so that each injection point of the ring oscillator 102 may be the same capacitive loading. The replica injection apparatus 106 includes three buffers. As shown in FIG. 8, the gains of these three buffers match their respective buffers in the main injection apparatus 104.

In sum, one advantageous feature of having a digital calibration algorithm for calibrating the injection-locked oscillator 200 is that the tunable buffers help to keep the locking range of the injection-locked oscillator 200 constant across different operating conditions such as different data sampling rates, different operating voltages, different environment temperatures and/or the like.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
   a ring oscillator comprising a plurality of delay cells connected in cascade;
   a main injection apparatus comprising a plurality of main buffers, wherein the main buffers receive a reference clock from their inputs and outputs of the main buffers are coupled to respective inputs of the delay cells; and
   a replica injection apparatus comprising a plurality of replica buffers, wherein:
   the replica buffers receive the reference clock from their inputs; and
   the replica buffers are configured such that:
      the replica buffers are tri-stated and each output is connected to ground when the ring oscillator operates in an injection-locked mode; and
      each output is connected to ground through a capacitor when the ring oscillator operates in a calibration mode.

2. The apparatus of claim 1, wherein:
the ring oscillator comprises a first delay cell, a second delay cell, a third delay cell and a fourth delay cell connected in cascade, and wherein an output of the fourth delay cell is connected to an input of the first delay cell.

3. The apparatus of claim 2, wherein:
the main injection apparatus comprises a first main buffer, a second main buffer, a third main buffer and a fourth main buffer, and wherein:
an output of the first main buffer is connected to an input of the first delay cell;
an output of the second main buffer is connected to an input of the second delay cell;
an output of the third main buffer is connected to an input of the third delay cell; and
an output of the fourth main buffer is connected to an input of the fourth delay cell.

4. The apparatus of claim 3, wherein:
the first main buffer is of a first gain;
the second main buffer is of a second gain;
the third main buffer is of a third gain equal to one half of the second gain; and
the fourth main buffer is turned off.

5. The apparatus of claim 4, further comprising:
the replica injection apparatus comprises a first replica buffer, a second replica buffer and a third replica buffer, and wherein:
the first replica buffer is of a gain equal to the first gain of the first main buffer;
the second replica buffer is of a gain equal to the second gain of the second main buffer; and
the third replica buffer is of a gain equal to the third gain of the third main buffer.

6. The apparatus of claim 5, further comprising:
an adjustable current source coupled to the delays cells, the main buffers and the replica buffers, wherein the adjustable current source provides bias currents for the delays cells, the main buffers and the replica buffers.

7. The apparatus of claim 6, wherein:
the bias currents are adjusted such that a frequency of an output of the ring oscillator is approximately equal to a frequency of the reference clock.

8. A system comprising:
a calibration apparatus comprising an amplitude comparator, a frequency detector and a calibration state machine, wherein the calibration apparatus generates a fine-tuning code and a coarse-tuning code;
an adjustable current source coupled to the calibration apparatus; and
an injection-locked oscillator comprising:
a ring oscillator comprising a plurality of delay cells connected in cascade, wherein an output of the ring oscillator is connected to the calibration apparatus;
a main injection apparatus comprising a plurality of main buffers, wherein the main buffers receive a reference clock from their inputs and the outputs of the main buffers are coupled to respective inputs of the delay cells; and
a replica injection apparatus comprising a plurality of replica buffers, wherein bias currents of the delay cells, the main buffers and the replica buffers are provided by the adjustable current source.

9. The system of claim 8, wherein:
the replica buffers receive the reference clock from their inputs; and
the replica buffers are configured such that:
the replica buffers are tri-stated and each output is connected to ground when the injection-locked oscillator operates in an injection-locked mode; and
each output is connected to ground through a capacitor when the injection-locked oscillator operates in a calibration mode.

10. The system of claim 8, wherein:
the amplitude comparator has a first input receiving a reference signal and a second input receiving a clock signal from the output of the ring oscillator;
the frequency detector has a first input receiving the clock signal from the output of the ring oscillator and a second input receiving the reference clock; and
the calibration state machine has a first input coupled to an output of the amplitude comparator and a second input coupled to an output of the frequency detector.

11. The system of claim 10, wherein:
the calibration state machine generates a fine-tuning calibration code and a coarse-tuning calibration code, and wherein:
the fine-tuning code is configured to adjust bias currents of the delay cells, the main buffers and the replica buffers; and
the coarse-tuning code is configured to adjust gains of the replica buffers and the main buffers.

12. The system of claim 11, wherein:
the ring oscillator comprises:
a first delay cell, a second delay cell, a third delay cell and a fourth delay cell connected in series;
the main injection apparatus comprises a first main buffer, a second main buffer, a third main buffer and a fourth main buffer, and wherein:
an output of the first main buffer is connected to an input of the first delay cell;
an output of the second main buffer is connected to an input of the second delay cell;
an output of the third main buffer is connected to an input of the third delay cell; and
an output of the fourth main buffer is connected to an input of the fourth delay cell; and
the replica injection apparatus comprises a first replica buffer, a second replica buffer and a third replica buffer, and wherein the first replica buffer, the second replica buffer and the third replica buffer have inputs coupled to the reference clock.

13. The system of claim 12, wherein:
the first replica buffer is of a gain equal to a first gain of the first main buffer;
the second replica buffer is of a gain equal to a second gain of the second main buffer; and
the third replica buffer is of a gain equal to a third gain of the third main buffer.

14. A method comprising:
during an injection-locked mode, coupling outputs of a plurality of replica buffers of a replica injection apparatus to ground, disabling the replica buffers and injecting a reference clock into a ring oscillator having a plurality of delay cells through a plurality of main buffers of a main injection apparatus, wherein:
the main buffers receive the reference clock from their inputs and the outputs of the main buffers are coupled to respective inputs of the delay cells; and during a calibration mode, coupling each output of the plurality of replica buffers of the replica injection apparatus to ground through a capacitor and disabling the main buffers of the main injection apparatus; and during the calibration mode, comparing an output signal of the ring oscillator with the reference clock and generating a fine-tuning calibration code and a coarse-tuning calibration code.

15. The method of claim 14, further comprising:

comparing a frequency of the output signal of the ring oscillator with a frequency of the reference clock;

generating the fine-tuning calibration code based upon a first mismatch between the frequency of the output signal of the ring oscillator and the frequency of the reference clock; and adjusting bias currents of the delay cells, the main buffers and the replica buffers based upon the fine-tuning calibration code.

16. The method of claim 15, further comprising:

comparing an amplitude of the output signal of the ring oscillator with a predetermined reference level;

generating the coarse-tuning calibration code based upon a second mismatch between the amplitude of the output signal of the ring oscillator and the predetermined reference level; and adjusting gains of the main buffers and the replica buffers based upon the coarse-tuning calibration code.

17. The method of claim 16, further comprising:

digitally controlling the gains and the bias currents so as to minimize the first mismatch and the second mismatch over temperature and voltage variations.

18. The method of claim 17, further comprising:

digitally controlling the gains of the replica buffers so as to match gains of their respective main buffers.

19. The method of claim 17, further comprising:

adjusting the gains of the replica buffers and the main buffers until the amplitude of the output signal of the ring oscillator is greater than or equal to the predetermined reference level.

20. The method of claim 14, wherein:

the capacitor is of a capacitance value approximately equal to a loading capacitance at an output of the main buffer.

* * * * *